United States Patent
Fraas

(10) Patent No.: US 10,374,119 B1
(45) Date of Patent: Aug. 6, 2019

(54) HETEROJUNCTION GASB INFRARED PHOTOVOLTAIC CELL

(71) Applicant: JX Crystals Inc., Issaquah, WA (US)

(72) Inventor: Lewis M. Fraas, Issaquah, WA (US)

(73) Assignee: JX Crystals Inc., Issaquah, WA (US)

( * ) Notice: Subject to any disclaimer, the term of this patent is extended or adjusted under 35 U.S.C. 154(b) by 0 days.

(21) Appl. No.: 15/819,894

(22) Filed: Nov. 21, 2017

Related U.S. Application Data

(60) Provisional application No. 62/424,636, filed on Nov. 21, 2016.

(51) Int. Cl.
| | |
|---|---|
| *H01L 31/0304* | (2006.01) |
| *H01L 31/18* | (2006.01) |
| *H01L 31/0224* | (2006.01) |
| *H01L 31/0749* | (2012.01) |

(52) U.S. Cl.
CPC .... *H01L 31/184* (2013.01); *H01L 31/022441* (2013.01); *H01L 31/022475* (2013.01); *H01L 31/0749* (2013.01)

(58) Field of Classification Search
CPC ........... H01L 31/184; H01L 31/022441; H01L 31/02245; H01L 31/0749
See application file for complete search history.

(56) References Cited

U.S. PATENT DOCUMENTS

| | | | |
|---|---|---|---|
| 5,217,539 A | 6/1993 | Fraas | |
| 2010/0301454 A1* | 12/2010 | Zhang | ................. H01L 31/0687 257/614 |
| 2017/0110611 A1* | 4/2017 | Cuminal | ........... H01L 31/03046 |

OTHER PUBLICATIONS

Cuminal et al., Design of mid-infrared InAs/GaSb superlattice detectors for room temperature operation, Finite Elements, Analysis and Design, Science Direct, vol./Issue 44 pp. 611-616 (Year: 2008).*

Mueller et al., Heterojunction Silicon Wafer Solar Cells using Amorphous Silicon Suboxides for Interface Passivation, Energy Procedia, SciVerse, Science Direct, vol./Issue 15, pp. 97-106 (Year: 2012).*

Yin et al., 19.2% Efficient InP Heterojunction Solar Cell with Electron-Selective TiO2 Contact, Photonics, American Chemical Society (ACS) Publications, vol./Issue 1, pp. 1245-1250 (Year: 2014).*

H. Askari et al, Electrical and Optical Properties of ITO Thin Films (2014).

(Continued)

*Primary Examiner* — Jayne L Mershon

(74) *Attorney, Agent, or Firm* — James Creighton Wray; Meera P. Narasimhan

(57) ABSTRACT

Heterojunction GaSb Photocells for operating in wavelengths around 1.6 microns have P type GaSb wafers with backside P+ back metal contacts. Patterned active areas are created on the front side and receive a thin passivation film. A thin N+ transparent $SnO_2$ or tin conductive oxide is deposited on the passivation film. A front contact grid is deposited. The thin passivating film is either amorphous silicon (a-Si:H) or $TiO_2$ with a hydrogen plasma pretreatment. The deposited N+ transparent $SnO_2$ or tin conductive oxide forms an N+/P Heterojunction cell. Front grid contacts and full back contacts are deposited. An antireflective coating is applied through the grids.

16 Claims, 11 Drawing Sheets the N+ $SnO_2$ on P GaSb heterojunction cell structure.

(56) References Cited

OTHER PUBLICATIONS

Smaali Assia, et al, Optical Reflectance of Pure and Doped Tin Oxide: From Thin Films to Poly-Crystalline Silicon/Thin Film Device, International Journal of Chemical, Molecular, Nuclear, Materials and Metallurgical Engineering vol. 2, No. 8, (2008).

Z.Y.Banyamin et al, Electrical and Optical Properties of Fluorine Doped Tin Oxide Thin Films Prepared by Magnetron Sputtering, Coatings 2014, 4, 732-746; doi:10.33390/coatings4040732.

Clark I. Bright, 3M Company, Review of Transparent Conductive Oxides (TCO)—The Society of . . . www.svcorg/DigitalLibrary/documents/2008_Fall_CIBright.pdf; Chapter 7 from 50 Years of Vacuum Coating Technology and the Growth of the Society of Vacuum Coaters, edited by Donald M. Mattox and Vivienne Harwood Mattox, Society of Vacuum Coaters, 2007.

P. S. Dutta et al, Passivation of surface and bulk defects in p-GaSb by hydrogenated amorphous silicon treatment, J. Appl. Phys. 79 (6), Mar. 15, 1996.

L. Fraas, Chapter 11 in Low Cost Solar Electric Power, Springer (Jul. 2014).

L. Tang, L. Fraas, et al, Performance Improvement of the GaSb Thermophotovoltaic Cells With n-Type Emitters, IEEE Transactions on Electron Devices ( vol. 62, Issue: 9, Sep. 2015 ).

Chun You Wei et al, Efficiency Improvement of HIT Solar Cells on p-Type Si Wafers, Materials 2013, 6, 5440-5446, doi:10.3390/ma6115440.

Xingtian Yin et al, 19.2% Efficient InP Heterojunction Solar Cell with Electron-Selective $TiO_2$ Contact, ACS Photonics. Dec. 17, 2014; 1(12): 1245-1250.

\* cited by examiner

IQE, EQE, and REF (reflection) of the GaSb cells with n-type emitters [3].

Dependence of minority carrier diffusion length in p- and n-type GaSb on majority carrier concentration [3].

Heteerojunction N+ ITO/P InP Solar Cell

EQE, 1-R characteristics [4] measured under 1-sun for ITO TiO$_2$/InP solar cells, with and without H$_2$ plasma treatment prior to ALD of TiO$_2$.

PL spectra of undoped p-type GaSb recorded at 80 K
(i) without an a-Si:H layer; (ii) with and a-Si:H layer.
An enhancement in luminescence intensity of up to 20 times is
seen due to the passivation of nonradiative recombination centers.

the N+ SnO₂ on P GaSb heterojunction cell structure.

The N+ SnO$_2$ on P GaSb heterojunction cell structure with a thin 10 nm thick TiO$_2$ insulating passivation layer along with a Hydrogen plasma pretreatment.

| N+ SnO$_2$ on P Process | N+ SnO$_2$ on P GaSb |
|---|---|
| 1.) GaSb P wafer |  |
| 2.) Deposit SiNx |  |
| 3.) Diffuse backside P+ |  |
| 4.) Pattern active area |  |
| 5.) Deposit thin TiO$_2$ or a-SiH passivation |  |
| 6.) Deposit N+ Transparent SnO$_2$ or TCO |  |
| 7.) & 8.) Deposit front & back contacts |  |

Heterojunction N+ SnO$_2$ on P GaSb Cell Process

HETEROJUNCTION GASB INFRARED PHOTOVOLTAIC CELL

This application claims the benefit of U.S. Provisional Application No. 62/424,636 filed Nov. 21, 2016, which is hereby incorporated by reference in its entirety as if fully set forth herein.

BACKGROUND OF THE INVENTION

A problem exists in how to create a low cost GaSb infrared photovoltaic cell for thermophotovoltaic applications using man made heat sources operating at approximately 1500K where the cell has a high quantum efficiency in a band near 1.6 micron.

SUMMARY OF THE INVENTION

In 1989, Fraas and Avery demonstrated a 35% efficient GaAs/GaSb stacked solar cell. The primary innovation was the P+/N diffused junction GaSb PV Cell. A patent issued on this invention in 1993 [1]. In that solar cell application, the GaSb cell responded to solar radiation with wavelengths between 0.9 to 1.7 microns but the most important solar energy in that band was near 1 micron. As seen in the dashed line in FIG. 1, the internal quantum efficiency (IQE) at 1 micron is a respectable 87%. However, there is now considerable interest in using GaSb cells with man made heat sources operating at 1500 K instead of the sun's temperature of 6000 K. In that thermophotovoltaic (TPV) application [2], the IQE at 1.6 microns is very important. As is seen in the dashed curve in FIG. 1, the IQE is only 73% at 1.6 microns and falling rapidly at longer wavelengths [3]. There is a need for an improved GaSb cell with a better IQE near the GaSb cell band edge at 1.7 microns.

Tang, Fraas, et. al. [3] have pointed out that the minority carrier diffusion length for electrons is longer than for holes in GaSb as is shown in FIG. 2 and this implies that the IQE at 1.6 microns should be higher for N+ on P GaSb cells than for P+ on N cells. This has led to the improved calculated IQE solid curve in FIG. 1 with the IQE now at over 90% at 1.6 microns. However, there is now a need to design and identify a simple fabrication process for this improved N+ on P GaSb cell.

There are three paths for making high efficiency single crystal photovoltaic (PV) cells. The first path is by a diffusion process as for silicon solar cells or as has been done via zinc diffusion to make the P+ on N GaSb cell. L. Tang has tried tellurium diffusion into GaSb to make an N+ on P GaSb cell so far without success. The second path is by epitaxially growing the P and N+ layers. While this can be a successful path, this MOCVD (metal-organic chemical vapor deposition) process uses expensive equipment and dangerous poisonous gases. A third path is to deposit an N+ transparent oxide on a P type wafer as has been done to make Indium Tin Oxide (ITO) on InP (Indium Phosphide) solar cells [4] as shown in FIG. 3. As is shown in table 1, this method has produced 19.2% efficient solar cells which are almost as good as more traditional N+ on P 22.1% MOCVD homojunction cells. Most importantly, the IQE near the InP bandedge is over 90% after correcting for reflection loss as shown in FIG. 4.

TABLE 1

Comparison of State-of-the-Art InP Solar Cell Performance Parameters (Measured under AM1.5, for Cell Areas)

| Device Type | Description | $V_{oc}$ [mV] | $J_{SC}$ [mA/cm$^2$] | FF [%] | eff [%] |
|---|---|---|---|---|---|
| MOCVD | homojunction | 878 | 29.5 | 85.4 | 22.1 |
| ITO/TiO$_2$/InP | heterojunction | 785 | 30.5 | 80.1 | 19.2 |

It is now tempting to simply propose an N+ ITO on P GaSb PV cell. However, there are two problems with this. As shown in FIG. 5, while the ITO is transparent out to the InP band edge at 0.95 microns, it is not transparent out to the GaSb band edge at 1.7 microns.

The second problem is evident in FIGS. 3 and 4. FIG. 3 shows a thin insulating layer between the ITO and the InP and FIG. 4 indicates that a Hydrogen plasma treatment has improved the IQE. Recombination centers in the heterojunction region are being passivated by a hydrogen treatment. This reminds one of the ITO Heterojunction with intrinsic thin layer (HIT) silicon solar cell shown in FIG. 6 where thin hydrogenated amorphous silicon (a-Si:H) layers are used to passivate the silicon crystal surfaces [6].

In fact, as shown in FIG. 7, a-Si:H thin film coating on the surface of p-type GaSb crystals has been shown to passivate the GaSb surface recombination centers [7].

FIG. 8 shows a heterojunction N+ on P GaSb infrared photovoltaic cell apparatus. It has a P type GaSb single crystal substrate with a front side and a back side. A P+ ohmic metal contact is on the back side. The front side has a thin passivating coating.

An N+ transparent conductive oxide coating is on the thin passivating front side coating and a collecting front metal grid is on the transparent conductive oxide coating.

The P type GaSb crystal is doped to between 0.5 and 2×10$^{17}$/cm$^3$.

The thin passivating layer is an a-Si:H layer. Alternately, the thin passivating layer is TiO$_2$ with a hydrogen plasma treatment. The N+ transparent conductive oxide is fluorine doped tin oxide with doping between 0.5 and 1.5×10$^{20}$/cm$^3$.

An antireflection coating is silicon Nitride (SiNx).

Plural cells are arranged in a panel of cells, and plural panels form an array of panels.

A process includes providing a GaSb P type wafer having a front side and a back side, depositing a first SiNx layer on the front side of the wafer, diffusing a P+ back contact on a back side of the wafer, patterning the first SiNx layer, and creating cell active areas on the front side, depositing a passivation layer on the cell active areas, depositing an opposite charge layer on the passivation layer, depositing and patterning a second SiNx layer as an antireflection coating layer, and depositing front and back contacts on the front side and the back side, respectively.

The depositing of a passivation layer comprises depositing an a-SiH layer

An N+ transparent SnO$_2$ layer is deposited before depositing the front contacts.

A SiNx antireflection layer is deposited and patterned grid openings are created in the SiNx antireflection layer. The depositing of the front contacts includes depositing front contacts through the grid openings and through the antireflection layer. The depositing of the back contacts includes covering a back of the wafer with the back metal.

Photocells for operating in wavelengths around 1.6 microns have P type GaSb wafers with P+ backside ohmic contact layer. Pattern active areas are created on the front side and receive a thin passivation film. Thin N+ transparent SnO$_2$ or tin conductive oxide is deposited on the passivation film. A front contact grid is deposited. An antireflective coating is applied through the grid. A back metal contact covers the entire P+ diffused layer.

Front sides are coated with thin layers of SiNx. Pattern active layers are formed on the front sides. Thin TiO$_2$ or a-Si:H passivation layers are added to the pattern active layers. N+ transparent SnO$_2$ or tin conductive oxide is deposited. Front and back contacts are deposited. Front contacts are grids. The back contacts fully cover the back sides. Antireflective coating is applied through the grid contacts.

These and further and other objects and features of the invention are apparent in the disclosure, which includes the above and ongoing written specification, with the claims and the drawings.

DETAILED DESCRIPTION OF THE INVENTION

This invention provides the solutions to problems just described.

The high electron density in transparent conductive oxides leads to a plasma wavelength $\lambda_p$ given by the Drude model as:

$$\lambda_p = 2\pi c \left(\frac{\varepsilon_\infty \varepsilon_o m^*}{Ne^2}\right)^{1/2} \quad (1)$$

Where c is the speed of light, e is the charge on an electron, $\varepsilon_o$ and $\varepsilon_\infty$ represent the dielectric constants of the medium and free space, respectively, m* is the effective mass of the charge carrier and Ne is the carrier concentration. The plasma wavelength is defined at T=R where the dielectric-like transmission equals the metallic-like IR reflection.

Figure 5:
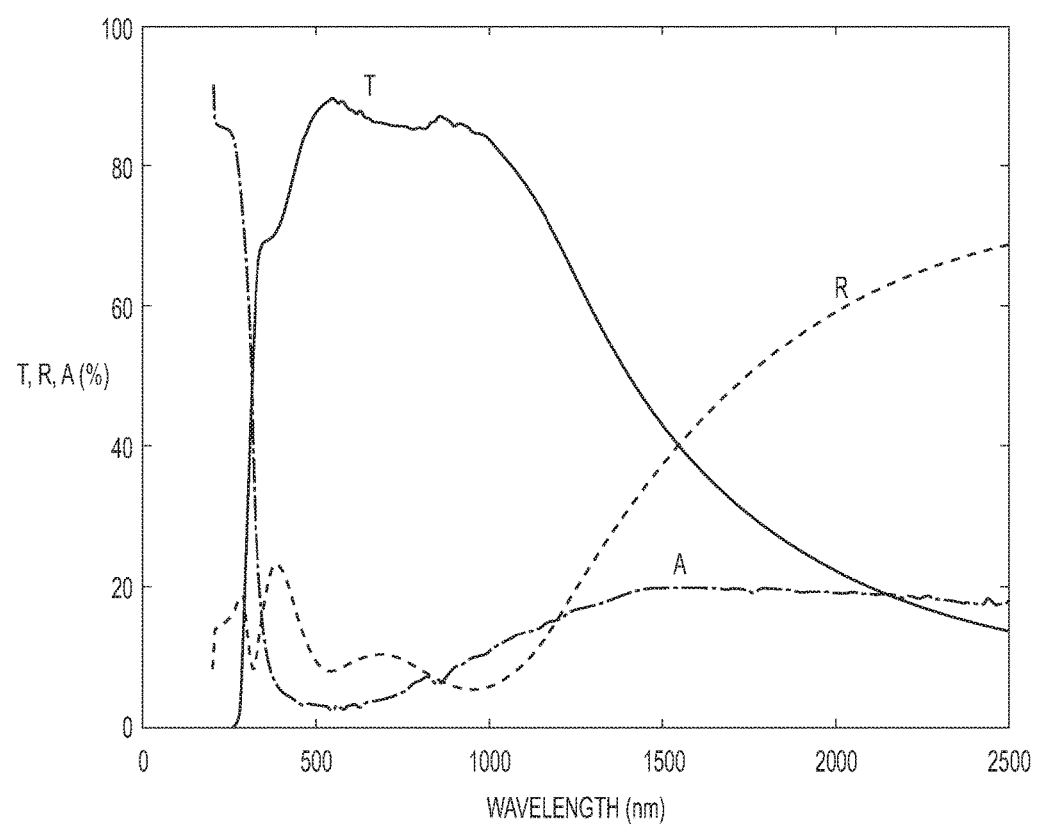
FIG. 5 shows transmission and reflection spectra [5] for ITO

In ITO as shown in FIG. 5, the plasma wavelength is at 1.6 microns [5]. The ITO film is reflective at longer wavelengths. Specifically from [5], $\lambda p_{ITO}$=1.67 microns with $N_{ITO}$=6.4×10$^{20}$/cm$^3$. However, the plasma wavelength in SnO$_2$ transparent conductive oxide films is at approximately 3 microns [8]. From [9], when 5% fluorine is incorporated in SnO$_2$ forming Fluorine Tin Oxide (FTO), then $N_{FTO}$=1.5×10$^{20}$/cm$^3$. This is consistent with equation (1).

$\lambda p_{FTO}$=$\lambda p_{ITO}(N_{ITO}/N_{FTO})^{1/2}$=1.67×(6.4/1.5)$^{1/2}$=1.67× 2.06=3.4 microns.

Therefore, SnO$_2$ films can be 90% transmitting at 1.6 microns [8] and [9].

Reference [9] gives a more detailed description of Fluorine doped Tin Oxide (FTO) films where the N+ electron concentration can be more precisely controlled. In order to keep the tin oxide (SnO$_2$) films transparent out to 1.8 microns, the Drude model indicates that the electron carrier concentration should be kept below 1.5×10$^{20}$/cm$^3$. However, the FTO film does need to be conductive for current collection by the metal grid. So the carrier concentration in the FTO film should be between about 5×10$^{19}$/cm$^3$ and 1.5×10$^{20}$/cm$^3$.

However, FTO is not the only possible N+ transparent conductive oxide (TCO) that can be used to make the N+ on P GaSb Heterojunction cell described in this invention. Other candidate materials for a high conductivity TCO include the "classic" binary oxides of CdO, SnO, ZnO, with alternative dopants, and combinations of these binaries [10]. The criteria will still be that the N+ carrier concentration be such that the plasma wavelength is longer that 2 microns and that the N+ layer be conductive enough such that the grid shading loss will be less than 10%.

Figure 8:
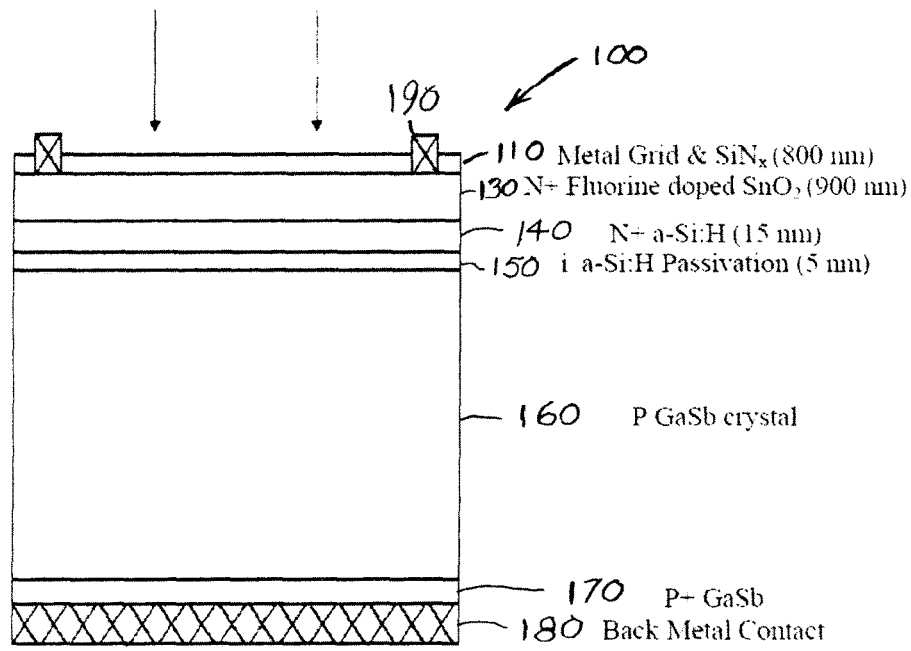
FIG. 8 shows the specific embodiment N+ SnO$_2$ on P GaSb heterojunction cell structure for this invention with a-SiH interface passivation.

FIG. 8 shows the embodiment N+ SnO$_2$ on P GaSb heterojunction cell structure 100 for this invention. A metal grid 190 and a SiN$_x$ layer 110 are on top of a fluorine-doped SnO$_2$ layer 130, a N+a-Si:H and an a-Si:H passivation layer 150 on the P GaSb crystal wafer 160. A P+ GaSb layer 170 and a back metal contact 180 are on the back of the wafer 160. Top metal contacts 190 extend through the layer 110 to the N+ fluorine-dosed SnO$_2$ layer 130.

Figure 9:
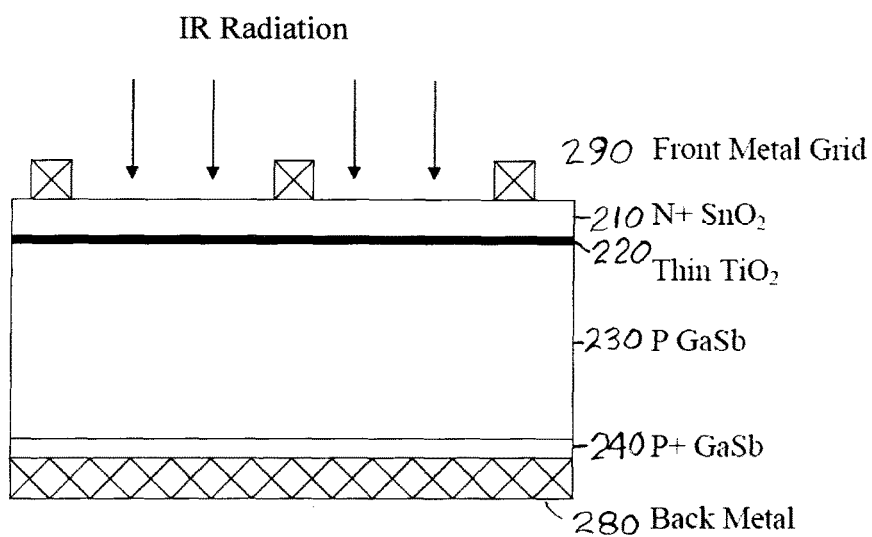
FIG. 9 shows the specific embodiment N+ SnO$_2$ on P GaSb heterojunction cell structure for this invention with a thin 10 nm thick TiO$_2$ insulating layer along with a Hydrogen plasma pretreatment interface passivation.

FIG. 9 shows the bandgap diagram for this N+ on P GaSb Heterojunction cell 200. An N+ SnO$_2$ layer 210 has a thin 10 nm thick TiO$_2$ insulating layer along with a Hydrogen plasma pretreatment passivation layer 220 and a P GaSb layer 230 and a P+ GaSb layer 240. A back metal contact 280 covers the back side of the cell. A front metal grid 290 contacts the N+SO$_2$ emitter layer 210. Importantly, note that in FIG. 8, there is a thin passivating a-Si:H layer between the N+ SnO$_2$ emitter layer and the P type GaSb base.

Figure 1:
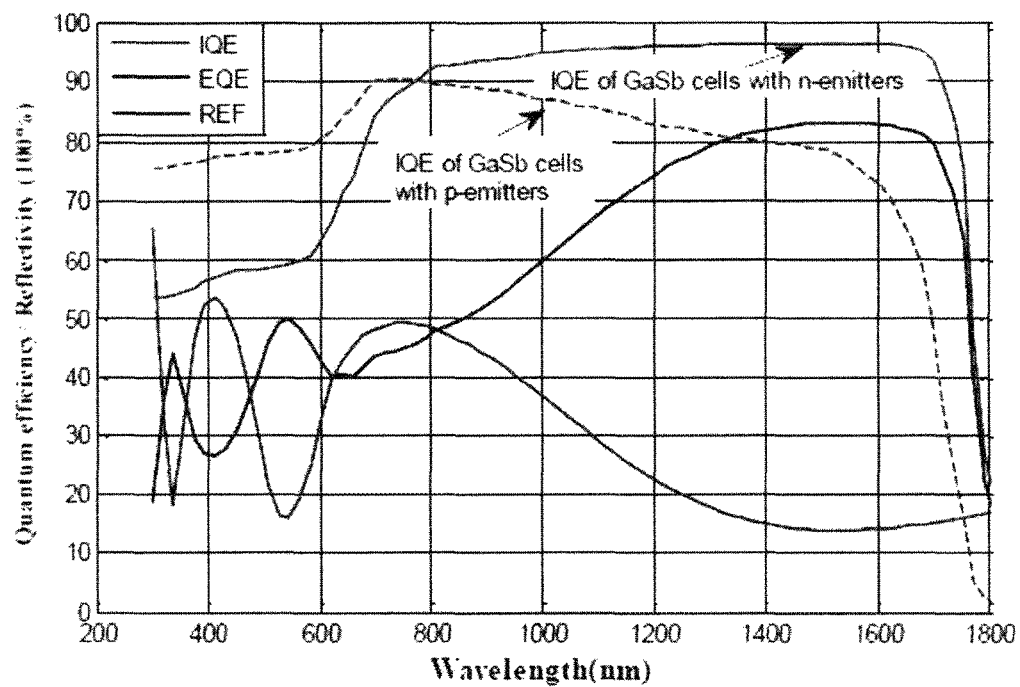
FIG. 1 shows IQE (internal quantum efficiency), EQE equivalent quantum efficiency), and REF (reflection) of the GaSb cells with n-type emitters [3].
Figure 2:
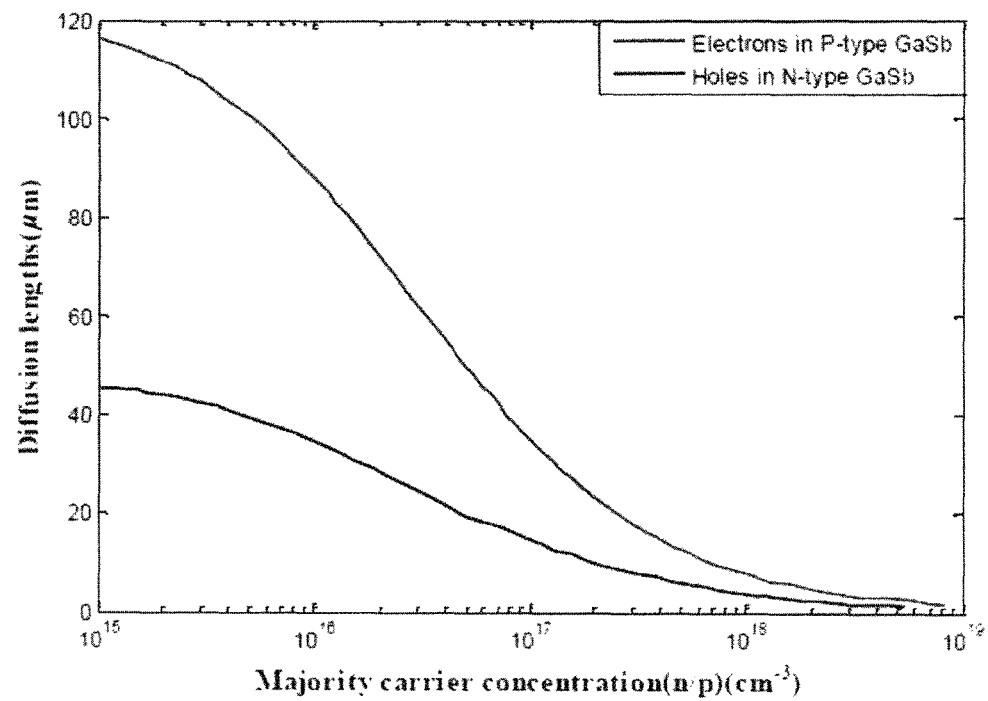
FIG. 2 shows dependence of minority carrier diffusion length in p- and n-type GaSb on majority carrier concentration [3].
Figure 3:
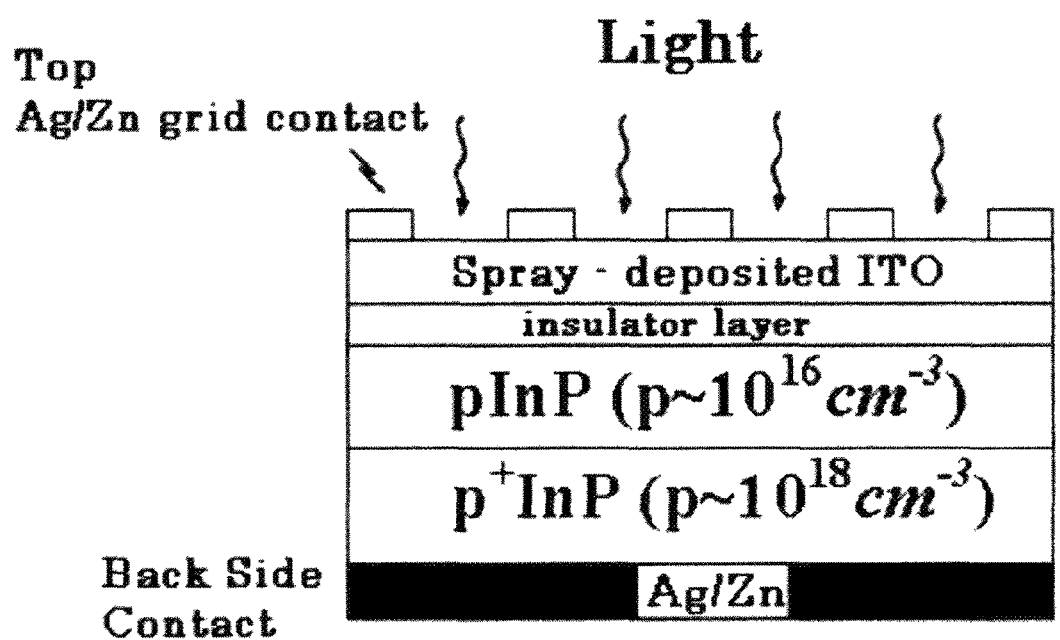
FIG. 3 shows a Heterojunction N+ ITO/P InP Solar Cell
Figure 4:
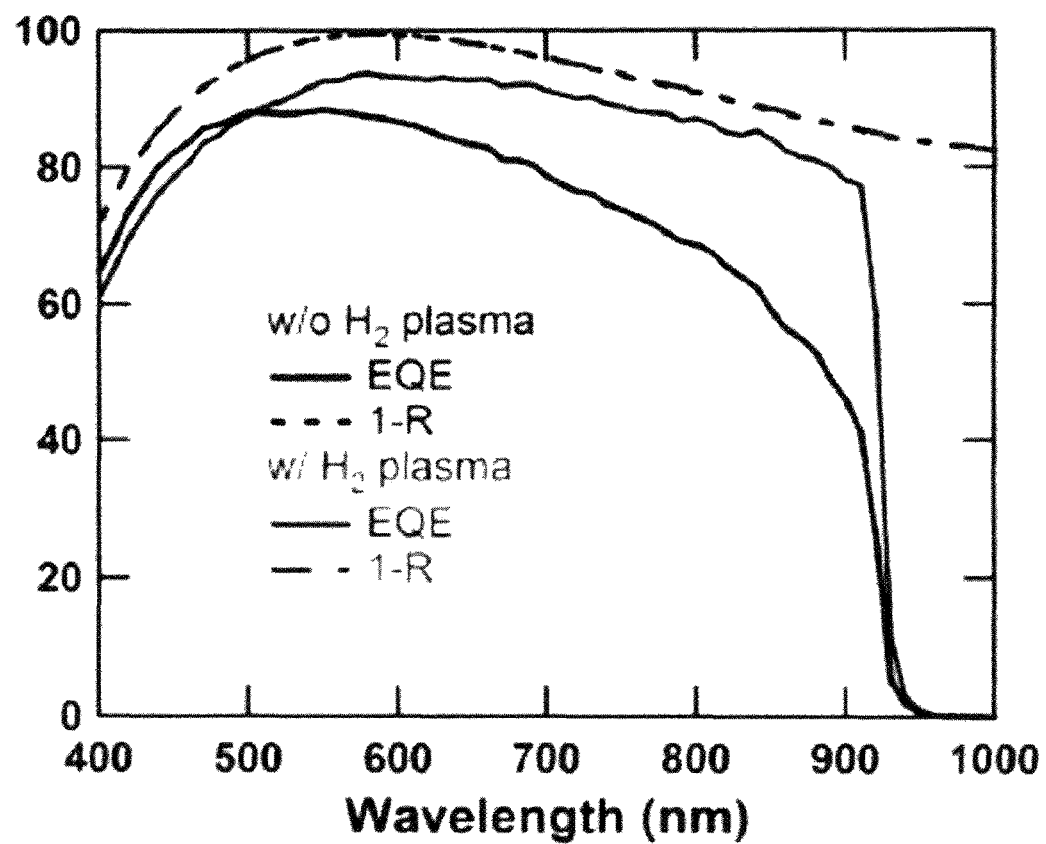
FIG. 4 shows EQE, 1-R characteristics [4] measured under 1-sun for ITO TiO$_2$/InP solar cells, with and without H$_2$ plasma treatment prior to ALD (atomic layer deposition) of TiO$_2$.
Figure 6:
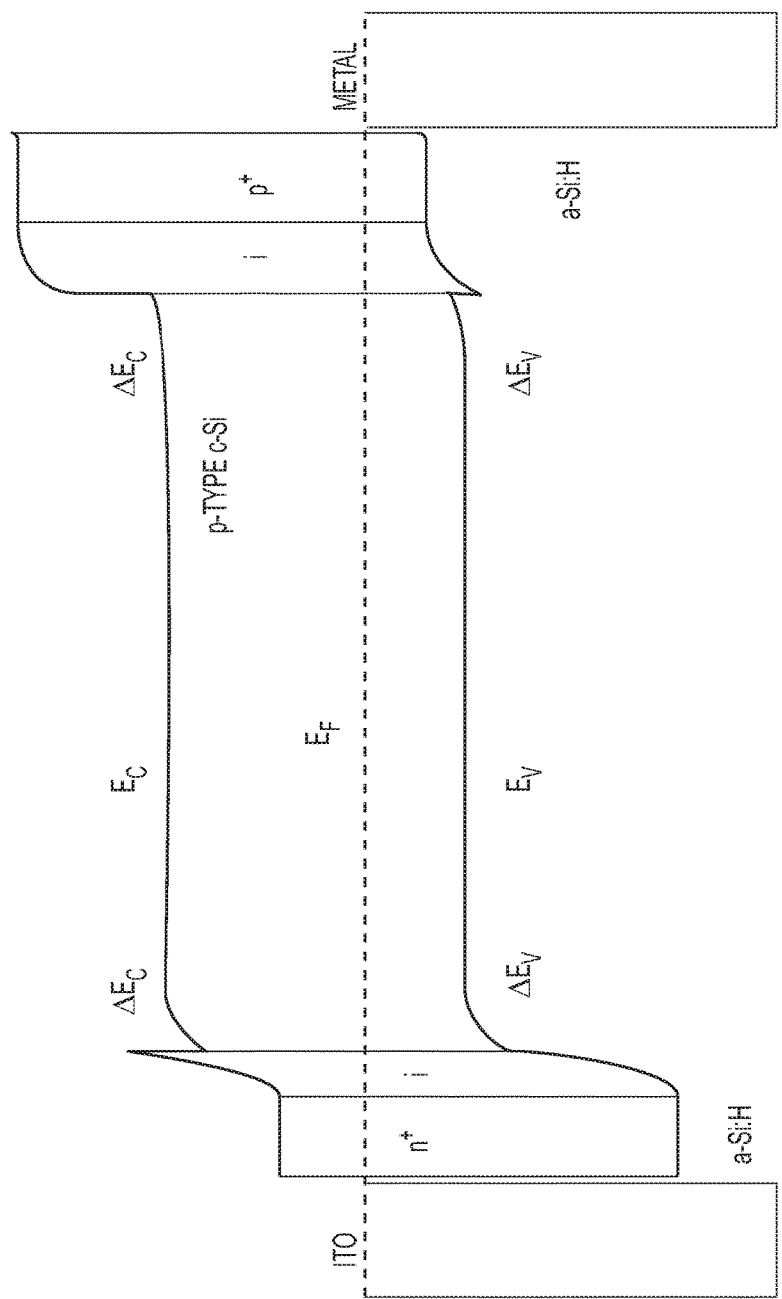
FIG. 6 is a band diagram for ITO a-Si:H passivated Si crystal Heterojunction (HIT) solar cell [6].
Figure 7:
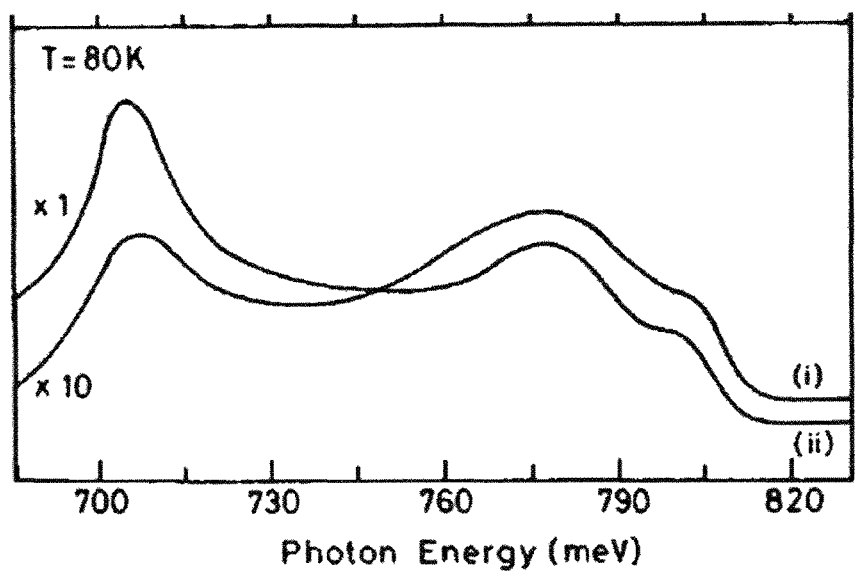
FIG. 7 shows photoluminescence spectra demonstrating the passivation of a GaSb surface with an a-SiH layer.
Figure 10:
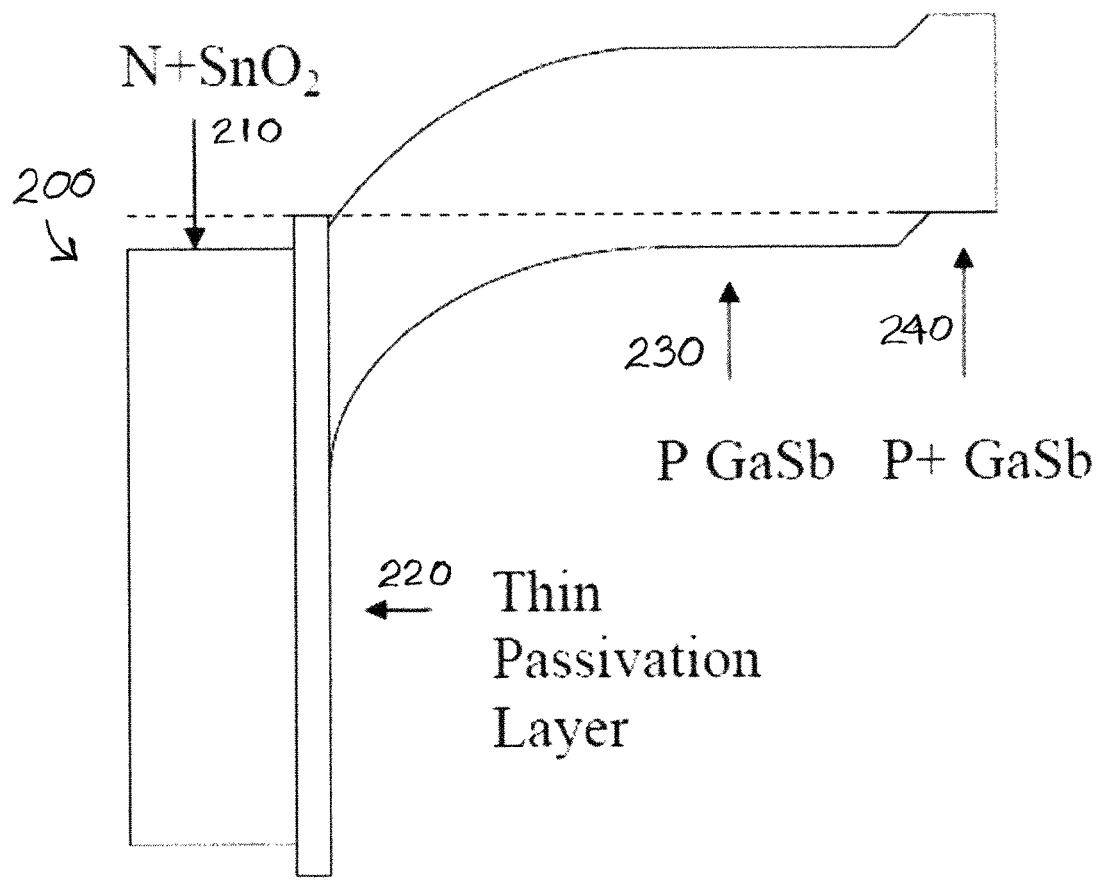
FIG. 10 shows the N+ transparent conductive oxide (TCO) on P GaSb Heterojunction structure in a more generalized form.

FIG. 10 shows the N+ TCO on P GaSb Heterojunction structure 200 in a more generalized form where there are actually two options for the thin passivating layer 220 between the N+ TCO emitter layer and the P type GaSb base. These two options are:
 (1) a thin 10 nm thick TiO$_2$ insulating layer along with a Hydrogen plasma pretreatment as in FIG. 4 or
 (2) a thin 20 nm thick a-Si:H passivating layer as in FIGS. 6 and 8.

Finally, it should be noted that the thicknesses specified in the top silicon nitride (SiN$_x$), SnO$_2$, and passivating layers are approximate. The key criteria is that their sum thickness should be chosen to be an antireflection coating (AR) with a minimum reflection at 1.6 microns.

Figure 11:
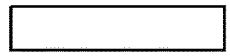
FIG. 11 shows the process for fabricating N+ SnO$_2$ on P GaSb heterojunction IR cells
Figure 11:
Figure 11:
Figure 11:
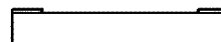
Figure 11:
Figure 11:
Figure 11:

FIG. 11 shows a GaSb cell process sequence for fabricating N+ SnO$_2$ on P GaSb heterojunction IR. A GaSb P wafer 11 is provided. A SiNx layer 12 is deposited on the wafer 11. A diffuse P+ layer 13 is formed on the back side of wafer 11. A pattern active area 14 is formed on the SiNx layer 12. A thin TiO$_2$ or a-SiH passivation layer 15 is added. An N+ transparent SnO$_2$ or TCO layer 16 is added to the front side. Front contacts 17 and a back contact 18 complete the cell 20. Note that this process is actually simpler compared to the previous P+ on N GaSb cell process now including one diffusion step instead of two and two patterning steps instead of three.

Advantages of the present invention, among others, include:

No epitaxy or toxic gases are required.

Simpler lower cost processes are provided.

The SnO$_2$ reflection at wavelengths longer than 2 microns provides energy feedback, potentially increasing TPV system efficiency.

The passivating layer reduces interface recombination losses and increases the IQE at 1.6 microns thereby increasing the GaSb cell TPV conversion efficiency.

REFERENCES

1.) L. Fraas, J. Avery, et al, III-V solar cells and doping processes U.S. Pat. No. 5,217,539 A (1993).
2.) L. Fraas, Chapter 11 in *Low Cost Solar Electric Power*, Springer (July, 2014).
3.) L. Tang, L. Fraas, et al, Performance Improvement of the GaSb Thermophotovoltaic Cells With n-Type Emitters, *IEEE Transactions on Electron Devices* (Volume: 62, Issue: 9, September 2015).
4.) Xingtian Yin et al, 19.2% Efficient InP Heterojunction Solar Cell with Electron-Selective TiO$_2$ Contact, *ACS Photonics*. 2014 Dec. 17; 1(12): 1245-1250.
5.) H. Askari et al, Electrical and Optical Properties of ITO Thin Films (2014).
6.) Chun You Wei et al, *Efficiency Improvement of HIT Solar Cells on p-Type Si Wafers*, Materials 2013, 6, 5440-5446, doi:10.3390/ma6115440.
7.) P. S. Dutta et al, Passivation of surface and bulk defects in p-GaSb by hydrogenated amorphous silicon treatment, J. Appl. Phys. 79 (6), 15 Mar. 1996.
8.) Smaali Assia, et al, Optical Reflectance of Pure and Doped Tin Oxide: From Thin Films to Poly-Crystalline Silicon/Thin Film Device, International Journal of Chemical, Molecular, Nuclear, Materials and Metallurgical Engineering Vol: 2, No: 8, (2008).
9.) Z. Y. Banyamin et al, Electrical and Optical Properties of Fluorine Doped Tin Oxide Thin Films Prepared by Magnetron Sputtering, Coatings 2014, 4, 732-746; doi: 10.33390/coatings4040732.
10.) Review of Transparent Conductive Oxides (TCO)— The Society of . . . www.svc.org/DigitalLibrary/documents/2008_Fall_CIBright.pdf Chapter 7 from 50 Years of Vacuum Coating Technology and the Growth of the Society of Vacuum Coaters, edited by Donald M. Mattox and Vivienne Harwood Mattox, Society of Vacuum Coaters, 2007

While the invention has been described with reference to specific embodiments, modifications and variations of the invention may be constructed without departing from the scope of the invention, which is defined in the following claims.

I claim:

1. Apparatus comprising:
heterojunction N+ on P GaSb infrared photovoltaic cell, further comprising:
a P type GaSb single crystal substrate having a front side and a back side,
a P+ ohmic metal contact on the back side,
a thin passivating front side coating,
a N+ transparent conductive oxide coating on the thin passivating front side coating, and
a collecting front metal grid on the transparent conductive oxide coating; wherein the heterojunction is between the N$^+$ transparent conductive oxide coating and the P type GaSb single crystal substrate.

2. The apparatus of claim 1, wherein the P type GaSb crystal is doped to between 0.5 and 2×10$^{17}$/cm$^3$.

3. The apparatus of claim 1, wherein the thin passivating layer is a-Si:H layer.

4. The apparatus of claim 1, wherein the thin passivating layer is TiO$_2$ with a hydrogen plasma treatment.

5. The apparatus of claim 1, wherein the N+ transparent conductive oxide is fluorine doped tin oxide with doping between 0.5 and 1.5×10$^{20}$/cm$^3$.

6. The device of claim 1, further comprising an antireflection coating on the front side.

7. The apparatus of claim 6, wherein the antireflection coating is SiNx.

8. The apparatus of claim 1, further comprising plural cells in a panel of cells.

9. The apparatus of claim 8, further comprising plural panels in an array of panels.

10. A process for forming an infrared photovoltaic cell comprising:
providing a P type GaSb single crystal wafer as the substrate, having a front side and a back side,
depositing a SiN$_x$ layer on the front side of the wafer,
diffusing a P$^+$ ohmic metal contact on the back side of the wafer,
patterning the SiN$_x$ layer, and creating cell active areas on the front side,
depositing a passivation layer on the cell active areas,
depositing an N$^+$ transparent conductive oxide coating on the passivation layer,
depositing and patterning an antireflection coating layer, and
depositing front and back contacts on the front side and the back side, respectively;
wherein a heterojunction is formed by the N$^+$ transparent conductive oxide coating and the p type GaSb single crystal substrate.

11. The process of claim 10, wherein the depositing of a passivation layer comprises depositing an a-SiH layer.

12. The process of claim 10, wherein the depositing and creating an antireflection area comprises depositing a SiNx layer.

13. The process of claim 10, further comprising depositing an N+ transparent SnO$_2$ layer before depositing the front contacts.

14. The process of claim 10, further comprising depositing a SiNx antireflection layer and creating patterned grid openings in the SiNx antireflection layer.

15. The process of claim 14, wherein the depositing front contacts comprises depositing front contacts through the grid openings and through the antireflection layer.

16. The process of claim 10, wherein the depositing the back contacts comprises covering a back of the wafer with the back contact.

* * * * *